United States Patent
Hwang et al.

(10) Patent No.: US 6,660,786 B2
(45) Date of Patent: Dec. 9, 2003

(54) FLAME RETARDED EPOXY RESIN COMPOSITION

(75) Inventors: Kuen-Yuan Hwang, Hsinchu (TW); Hong-Hsing Chen, Hsinchu (TW); Tsung-Yu Chen, Hsinchu (TW); Ching Fu Kao, Hsinchu (TW)

(73) Assignee: Chang Chun Plastics, Co., Ltd. (TW)

( * ) Notice: Subject to any disclaimer, the term of this patent is extended or adjusted under 35 U.S.C. 154(b) by 184 days.

(21) Appl. No.: 09/811,948

(22) Filed: Mar. 19, 2001

(65) Prior Publication Data

US 2002/0082322 A1 Jun. 27, 2002

(30) Foreign Application Priority Data

Sep. 21, 2000 (TW) .................. 89119427 A

(51) Int. Cl.$^7$ .................. C08L 63/10; C08K 5/5399
(52) U.S. Cl. .................. 523/452; 524/116; 524/120
(58) Field of Search .................. 523/452; 524/120, 524/116

(56) References Cited

U.S. PATENT DOCUMENTS

| | | | |
|---|---|---|---|
| 4,973,631 A | 11/1990 | McGrath et al. | 418/66 |
| 5,086,156 A | 2/1992 | McGrath et al. | 528/108 |
| 5,376,453 A | 12/1994 | von Gentzkow et al. | 428/415 |
| 5,458,978 A | 10/1995 | Bottcher et al. | 428/413 |

FOREIGN PATENT DOCUMENTS

| | | | |
|---|---|---|---|
| GB | 2 304 716 | * | 3/1997 |
| JP | 259252 | * | 9/1998 |
| JP | 103939 | * | 4/2000 |

* cited by examiner

Primary Examiner—Peter Szekely
(74) Attorney, Agent, or Firm—Peter F. Corless; John B. Alexander; Edwards & Angell, LLP

(57) ABSTRACT

The present invention relates to a flame retarded epoxy resin composition, which is characterized by that said flame retarded epoxy resin composition comprising:

(A) at least one type of epoxy resin;
(B) a phosphorus-and-nitrogen-containing heterocyclic compound, said compound having a moiety which can react with the epoxy group of the epoxy resin, usedful as a hardening agent, and having a structure as shown by formula (I):

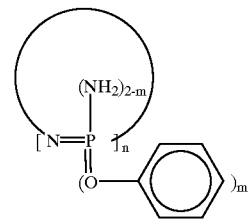

(1)

wherein m is an integer of from 0 to 2, n is an integer of from 3 to 7, but at least one m is not 2.

The epoxy resin composition consisting of the above components (A) and (B) has improved flame retarded property and thus is suitably used as the flame retarded material required for the parts of composite material, laminated plates, printed circuit boards, electronic products, electrical products, and the like. According to the range of applications, the composition can be selectively added with additives such as a hardening agent, which does not contain phosphorus, a hardening promoter, a solvent, and the like.

18 Claims, No Drawings

FLAME RETARDED EPOXY RESIN COMPOSITION

BACKGROUND OF THE INVENTION

1. Field of the Invention

The present invention relates to a flame retarded epoxy resin composition, which is characterized by that said flame retarded epoxy resin composition comprising A) at least one type of epoxy resin and (B) a phosphorus-and-nitrogen-containing heterocyclic compound having a moiety which can react with the epoxy group of the epoxy resin and useful as a hardening agent for epoxy resin.

The flame retarded epoxy resin composition mentioned above can reach the standard for flame retarded property of UL94V-0 without containing conventional flame retarded materials such as halides, antimony trioxide and the like. Thus, the said resin composition with excellent flame retarded properties is suitably used as the heat-resistant or flame-retarded materials required in the manufacture of electronic products, electric products, and automobile parts, and for other related applications.

2. Background of the Invention

While to the well known conventional epoxide has a limited usage range due to its combustible character, it has been known that the flame retarded property can be improved by adding resins containing halogen or haloalkyl group to the epoxide. In order to improve the flame retarded property of polymers or compositions thereof, flame retarded materials such as halo-organic compounds or oxides containing antimony or vanadium have traditionally been widely used to form high heat resistant compositions, however, the addition of such halo resins or polymers or metal (such as antimony) oxide is required in large amounts to attain the requirements for the flame retarded property.

Due to easy processability, high safety, and excellent mechanical and chemical properties, epoxy resins have been widely used in many fields, for example, in the application of composite material, such as coating, electrical insulation, construction, building materials, adhesives or laminated products. Further, now epoxy resins also can be used to make laminated plates for having strong adhesion to reinforcement materials (such as glass-fiber fabric) and no volatile elements formed and small shrinkage in hardening. On the other hand, laminated plates produced by epoxy resins have been massively applied to the component materials for electrical and electronic products and their other components.

In addition to a requirement to produce accurate and fine patterns on circuit boards, laminated plates are required to have excellent electrical properties, mechanical properties, and heat resistant processabilities for the currently significant manufacturing process of the printed circuit board. Most of widely used FR4 laminated plates or resin-coated copper foil for build-up process have a glass transition temperature of about 130° C. after hardening. In the manufacturing process of the printed circuit board, the temperature is over 200° C. during cutting and drilling, and even over 270° C. during welding, which may make laminated plates break or crack during the manufacturing process. Therefore, various resins which possess high heat stability and high glass transition temperature have been developed. In addition, for the laminated plates of printed circuit board, another important property is flame retardancy, which is absolutely necessary in some applications such as in airplanes, automobiles, and other items of public transportation.

In order to impart the flame retarded property to the material for laminated plates, substances that put out flames and decrease burning should be introduced. For the laminated plates of epoxy resin/glass-fiber systems (or organic fiber) or dielectric materials for build-up process, generally halogen-containing compounds, particularly bromine-containing epoxy resins and hardeners, are added in combination with flame retardants, such as diantimony trioxide and the like, to achieve the strict flame retarded standards (as the UL94V-0 level) in the laminated plates. The flame retarded substance in epoxy resin usually required to contain up to 21% of bromine, is used in combination with diantimony trioxide or other retardants to attain the standard of UL 94V-0. However, it is harmful to human health for using high contents of bromine in epoxy resin or diantimony trioxide. Additionally, toxic smokes of erosive free radicals and hydrogen bromide generated by bromine burning, and also toxic furan bromides and a dioxine bromide compound produced from aromatic compounds with high bromine contents during burning seriously affect human health and the environment. Accordingly, it is most urgent to find a novel flame retarded material and a method to provide flame retarded properties to solve the pollution and environmental problems caused by the current use of laminated products or components containing bromide or bromo-epoxy resin. Especially, corresponding to the massive use of FR-4 epoxy glass fiber laminated plates for electronic and electric products and components, it is necessary to actively develop flame retarded epoxy resin materials which will not endanger human beings and are environmentally protective.

Recently, in order to protect human health and decrease the sources of environmental pollution, various new flame retarded materials have been developed, wherein the technique is widely accepted for using phosphorus-containing compounds instead of those conventionally used flame retarded materials such as bromine-containing compounds. Currently phosphorus system compounds have been extensively studied and applied as the new generation of flame retarded materials with environmental-protective concepts. For example, red phosphorus or phosphorus-containing organic compounds (such as triphenyl phosphate, triphenylmethyl phosphate, etc.) are directly added to substitute halide compounds as a flame retarder to improve the burning property of polymer materials or hardening resin materials. However, addition of such flame retarded compounds in large amounts direct into resins is always required to achieve the effect of flame retardancy. Due to the smaller molecular weight of the compound, higher migration will affect the properties of resin substrates, for example, to worse electrical properties, adhesive strength, heat resistance, etc., and result in difficulty in application.

Later techniques using a reactive type of phosphorus-containing epoxy resin instead of bromine-containing or bromo-epoxy resins generally used as flame retarded ingredients have been developed. For example, in U.S. Pat. No. 5,376,453, laminated plates, which are produced by using a composition of phosphates with epoxy groups and nitrogen-containing hardening agents, need to be added with various phosphate-containing epoxy resins to increase phosphorus content to achieve the strict burning standard of UL 94V-0. In U.S. Pat. No. 5,458,978, a composition formed from epoxy phosphates, nitrogen-containing epoxy resin, and metal complex hardener is used to make laminated plates which have a glass transition temperature of about 175° C. and a flame retarded property similar to that of UL 94V-0 (42 seconds, 50 seconds related to critical value). In U.S. Pat. Nos. 4,973,631 and 5,086,156, a trialkyl oxide having an active hydrogen substituent (such as an amino group) is used alone or in combination with other amine hardeners to harden epoxy resins; by means of such a hardening method to introduce phosphorus to resins, however, a proper flame retarded effect can not be achieved due to the lower content of phosphorus; and there is no actual measurement of the flame retardant effect in these two patents. According to the techniques disclosed in the above patents, it is realized that addition of various or high contents of phosphorus-containing compounds is usually required to meet the flame retarded standard, however, various additional additives usually make the processing conditions of products difficult to control or the quality of products inferior.

Therefore, the method to increase flame retarded property employs a nitrogen- and phosphorus-containing substance instead of traditional bromine- or antimony-containing substances.

SUMMARY OF THE INVENTION

In accordance with environmental problems generated by flame retarded materials previously added with toxic substances containing halogens or antimony, the inventor of the present invention has developed a flame retarded compound corresponding to the environmentally protective requirements. The said compound is a phosphorus- and nitrogen-containing heterocyclic compound, and structurally has a moiety reactive with the epoxy group of an epoxy resin, and can be used as a hardener component of the epoxy resin composition.

According to the present invention, it has been found to increase the heat resistance of the epoxy resin composition by adding effective amounts of phosphorus- and nitrogen-containing heterocyclic compounds to epoxy resin. Besides having improved flame retarded properties, the epoxy resin composition formed by the foregoing phosphorus- and nitrogen-containing compound and the epoxy resin can also have the effect of increasing electric and mechanical properties, and have excellent processing properties. Accordingly, the production cost can be reduced because no large amount of flame retarded additives is required. In addition, such flame retarded resin compositions having a high glass transition temperature and excellent heat resistance are suitably used for production of prepregs with flame retarded properties, laminated layers, dielectric materials for build-up process and materials for printed circuit boards.

DETAILED DESCRIPTION OF THE PRESENT INVENTION

The present invention relates to a flame retarded epoxy resin composition, which is characterized by comprising:

(A) at least one type of epoxy resin;
(B) a phosphorus-and-nitrogen-containing heterocyclic compound, said compound having a moiety which can react with the epoxy group of epoxy resin and can be used as a hardening agent for epoxy resin. The structure is as shown by formula (I):

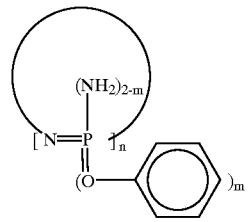

wherein m is an integer of from 0 to 2, n is an integer of from 3 to 7, but at least one m is not 2.

The flame retarded epoxy resin composition composed of the above components (A) and (B) has improved flame retardency and is suitable for flame retarded materials required for such as composite materials, laminated layers, printed circuit boards, electronic and electric product components. Additional additives such as hardening agents, which do not contain phosphorus, hardening promoters, solvents, etc can be added selectively according to the fields of application.

In the present invention, (A) epoxy resin component of the composition can be a general epoxide, including an epoxy resin composed of one or more epoxides, wherein said epoxy resin is characterized by an epoxy equivalent weight of less than 600. The types of epoxy resin useful in the present invention comprise the epoxides containing an epoxy group modified by the moiety such as bisphenol, phenol, dihydroxy-benzene, bis(biphenol), naphthalene, alkyl, alkenyl, nitrogen-containing heterocyclics, cresol-aldehyde, phenolic aldehyde resin, siloxane or polysiloxane, and aryl phosphate.

In the flame retarded epoxy resin composition of the present invention, the types of epoxy resin component having epoxy groups comprise glycidyl ether, glycidyl amine, glycidyl thio-ether, glycidyl carbonate, and the like, wherein the glycidyl ether modified by bisphenol, bis (biphenol), dihydroxybenzene, polyol, or silicone is preferred.

In the present invention the examples of such glycidyl ether modified by the specific groups, in the embodiment, comprise bisphenol-modified diglycidyl ether having —Ph—X—Ph— (wherein X is $CH_2$, $C(CH_3)_2$, $CH(CH_3)$, O, S, CO, or $SO_2$) moiety, such as bisphenol A glycidyl ether, bisphenol F glycidyl ether, bisphenol AD glycidyl ether, bisphenol S glycidyl ether, tetramethyl bisphenol A glycidyl ether, tetramethyl bisphenol F glycidyl ether, tetramethyl bisphenol AD glycidyl ether, tetramethyl bisphenol S glycidyl ether, and the like. The examples of bis (bisphenol)-modified diglycidyl ether, in the embodiment of the present invention, comprise 4,4'-biphenyl glycidyl ether, 3,3'-dimethyl-4,4'-biphenyl glycidyl ether, 3,3',5,5'-tetramethyl-4,4'-biphenyl glycidyl ether, etc. The examples of dihydroxy-benzene glycidyl ether, in the embodiment of the present invention, comprise resorcinol glycidyl ether, quinol glycidyl ether, and isobutyldihydroxybenzene glycidyl ether. The examples of phenolic aldehyde polyglycidyl ether, in the embodiment of the present invention, comprise phenol aldehyde polyglycidyl ether, cresol phenolic polyglycidyl ether, and bisphenol A phenolic polyglycidyl ether. The embodimental examples of polyhydroxyl-modified polyglycidyl ether comprise tris(4-hydroxyphenyl)methane polyglycidyl ether, tris(4-hydroxyphenyl)ethane polyglycidyl ether, tris(4-hydroxyphenyl)propane polyglycidyl ether, tris(4-hydroxyphenyl)butane polyglycidyl ether, tris (3-methyl-4-hydroxyphenyl)methane polyglycidyl ether, tris(3,5-dimethyl-4-hydroxyphenyl)methane polyglycidyl ether, tetrakis(4-hydroxyphenyl)ethane polyglycidyl ether, tetrakis(3,5-dimethyl-4-hydroxyphenyl)ethane polyglycidyl ether, etc. The epoxy resin mentioned above can be used alone or in combination as the mixture of two or more epoxy resins.

In the present invention, the foregoing epoxy resin component, preferably bifunctional bisphenol A polyglycidyl ether, resorcinol glycidyl ether, trifunctional tri(4-hydroxylphenyl)methane polyglycidyl ether, tetrafunctional tetra(4-hydroxylphenyl)ethane polyglycidyl ether, or cresol phenolic polyglycidyl ether, can be used alone or in combination as the mixture of two or more epoxy resins.

Further, the epoxy resin component in the present invention can be modified with silicones or rubber copolymers. The foregoing silicones compounds are such as siloxane with amino ending group (for example, trade name SF-8012, commercially available from Shin-Etsu Company, Japan). The rubber copolymers mentioned above are such as the carboxyl ending group copolymer of butadiene and acrylonitrile (for example, trade name CTBN, commercially available from Goodrich Company, USA) or the amino ending group copolymer of butadiene and acrylonitrile (for example, trade name CTBN, commercially available from Goodrich Company, USA).

In the flame retarded epoxy resin composition of the present invention, (B) phosphorus-and-nitrogen-containing heterocyclic compound is used to increase flame retardancy and heat resistance. Said compound has a moiety which can react with the epoxy group of the epoxy resin, and can be used as an epoxy resin hardening agent. The structure is as shown in formula (I):

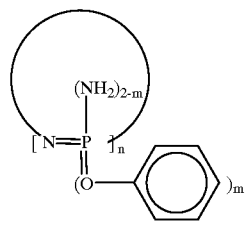

(1)

wherein m is an integer of from 0 to 2, n is an integer of from 3 to 7, but at least one m is not 2.

The ratio of (A) epoxy resin and (B) phosphorus-and-nitrogen-containing heterocyclic compound in the flame retarded epoxy resin composition of the present invention is such that, for the added amount of (B) phosphorus-and-nitrogen-containing heterocyclic compound having a moiety which can react with the epoxy group, according to the reactive hydrogen equivalent weight and epoxy equivalent weight of epoxy resin (A), the reactive hydrogen equivalent weight of the hardening agent (B) is from 20% to 95%, preferably from 40% to 90%, more preferably from 50% to 90%, related to the epoxy equivalent weight of 100%.

Additionally, the flame retarded epoxy resin composition of the present invention can be further added with (C) hardening agents, which do not contain phosphorus, (D) hardening promoters, (E) solvents, and (F) other additives which comply into high heat-resistant materials in various fields, such as applied in laminates, IC packaging materials, high heat resistant powder coating, and the like. Further, the viscosity can be controlled by adding solvents to formulate the type of varnish for use in the manufacturing of prepregs, laminates, dielectric materials for build-up process.

Suitable hardening agents, which do not contain phosphorus, comprise substances such as polyol, polyamine, polythiol, polycarbonates, and the like containing bisphenol, dihydroxybenzene, phenol, naphthalene, alkene, cyclohydrocarbon, nitrogen-containing heterocyclics, phenolic aldehyde resin, siloxane, polysiloxane, and having —Ph—X—Ph— (wherein X is $CH_2$, $C(CH_3)_2$, $CH(CH_3)$, O, S, CO, or $SO_2$) moiety. Also, hardening agents, which do not contain phosphorus, comprise amines, polyhydroxylphenols, and phenolic aldehydes. The examples of amines, in the embodiment, comprise dicyandiamide ($NH_2C(NH)(NHCN)$), diaminodiphenylmethane (DDM), and etc. Polyhydroxyl phenols comprise tris(4-hydroxyphenyl)methane, tris(4-hydroxyphenyl)ethane, tris (4-hydroxyphenyl)propane, tris(4-hydroxyphenyl)butane, tris(3-methyl-4-hydroxyphenyl)methane, tris(3,5-dimethyl-4-hydroxyphenyl)methane, tetrakis(4-hydroxyphenyl) ethane, tetrakis(3,5-dimethyl-4-hydroxyphenyl)ethane, and the like. The examples of phenolic aldehyde, in the embodiment, comprise phenol formaldehyde condensates, cresol phenolic condensates, and bisphenol A phenolic aldehyde condensates, etc.

The frequently used hardening agents, which do not contain phosphorus, are such as dicyandiamide ($NH_2C(NH)$ $(NHCN)$), diaminodiphenylmethane (DDM), diethyltriamine (DETA), diaminodibenzenesulfone (DDS), m-phenyldiamine (MPDA), methyl diphenylamine (MDA), maleic acid (MA), phthalic acid (PA), hexahydrophthalic acid (HHPA), tetrahydrophthalic acid (THPA), and the like.

The content of foregoing hardening agents, which do not contain phosphorus, is such that, according to reactive hydrogen equivalent weight of hardening agents, which do not contain phosphorus, and epoxy equivalent weight of epoxy resin, the reactive hydrogen equivalent weight of hardening agents, which do not contain phosphorus, is from 20% to 95%, preferably from 40% to 90%, and more preferably from 50% to 90%, related to the epoxy equivalent weight of epoxy resin of 100%.

In the flame retarded epoxy resin composition of the present invention, a hardening promoter can also be optionally added. Suitable hardening promoters comprise tertiary amines, tertiary phosphines, quaternary ammonium salts, quaternary phosphonium salts, and imidazole compounds, or mixtures thereof. The examples of the tertiary amines, in the embodiment, comprise triethylamine, tributylamine, dimethylaminoethanol, tris(N,N-dimethylaminomethyl) phenol, N,N-dimethylaminomethylphenol, etc. The examples of the tertiary phosphines, in the embodiment, comprise triphenylphosphine, etc. The examples of the quaternary ammonium salts, in the embodiment, comprise tetramethylammonium chloride, tetramethylammonium bromide, tetramethylammonium iodide, triethylbenzylammonium chloride, triethylbenzylammonium bromide, triethylbenzylammonium iodide, etc. The examples of the quaternary phosphonium salts, in the embodiment, comprise tetrabutylphosphonium chloride, tetrabutylphosphonium bromide, tetrabutylphosphonium iodide, tetrabutylphosphonium acetate complex, tetraphenylphosphonium chloride, tetraphenylphosphonium bromide, tetraphenylphosphonium iodide, ethyltriphenylphosphonium chloride, ethyltriphenylphosphonium bromide, ethyltriphenylphosphonium iodide, ethyltriphenylphosphonium acetate complex, ethyltriphenylphosphonium phosphate complex, propyltriphenylphosphonium chloride, propyltriphenylphosphonium bromide, propyltriphenylphosphonium iodide, butyltriphenylphosphonium chloride, butyltriphenylphosphonium bromide, butyltriphenylphosphonium iodide, etc. The imidazole compounds comprise 2-methylimidazole, 2-phenylimidazole, 2-ethyl-4-methylimidazole, 2-dodecyl-imidazole, 2-heptadecyl-imidazole, etc. Hardening promoters are preferably tertiary phosphines, and imidazole compounds, more preferably 2-methylimidazole, 2-phenylimidazole, ethyltriphenylphosphonium acetate complex, and butyltriphenylphosphonium bromide. The hardening promoter mentioned above can be use alone or in the form of a mixture thereof.

The optionally added amount of hardening promoters in the flame retarded epoxy resin composition of the present invention is from 0.005% to 5.0% by weight, preferably from 0.05% to 4.5% by weight, more preferably from 0.1% to 4.0% by weight, most preferably from 0.15% to 3.0% by weight of the total weight of the composition.

If the added amount of hardening promoters to the composition of the present invention is more than 5.0% by weight, it will shorten the reaction time but cause bad influence on the production of by-products and the consistency for the transforming rate of hardening reaction. If the hardening promoter content of the composition is less than 0.005% by weight, the reaction will be too slow to be efficient.

The flame retarded epoxy resin composition of the present invention can be added with solvents to form varnish. Adding solvents can adjust the viscosity of the epoxy resin composition of the present invention to from 20 to 500 cps/25° C. as an advantage for the production of prepregs by means of impregnation and drying or for the coating of dielectric layer for build-up process.

Suitable solvents for the formulation of varnish are organobenzenes, ketones, non-protonic solvents, ethers, esters, etc. Organobenzenes comprise toluene and xylene. Ketones comprise acetone, methyl ethyl ketone, and methyl isobutyl ketone. Nonprotonic solvents comprise N,N-dimethyl formamide and N,N-diethyl formamide. Ethers comprise ethanediol monomethyl ether and propanediol monomethyl ether. Esters comprise ethyl acetate and ethyl isopropionate.

Generally, the addition of the hardening promoters and the selectively added solvents to formulate the varnish of the composition of the present invention allows the viscosity to be controlled in the range of from 20 to 500 cps/25° C. and the gelation time to be controlled in the range of from 30 to 500 sec/171° C.

According to the applications and some specific uses, the flame retarded epoxy resin composition of the present invention can be added with general commercial additives or modifiers, for example, heat stabilizers, light stabilizers, UV absorbents, plasticizers, or inorganic fillers, etc. Although additives or modifiers containing halogen or antimony tri-oxide are also available, it is no suggested to use such additives in the composition of the present invention in view of the problems of environmental protection and toxicity.

After formulating the flame retarded epoxy resin composition disclosed in the present invention into varnish, laminates can be formed by can be laminated with copper foils, fiber supporters and the flame retarded epoxy resin composition containing phosphorus and nitrogen compound by the methods known in the art. A fibrous substrate can be impregnated with the flame retarded epoxy resin composition of the present invention. The fibrous substrate can be organic or inorganic material such as glass, metal, carbon fiber, inorganic fiber (for example, boron fiber), cellophane, cellulose, and organic polymer material, etc. For example, after the glass fiber fabric is impregnated with the epoxy resin composition varnish of the present invention, it is then dried by heating, giving a dry prepreg; such prepregs having excellent storage stabilities can be stored for months under room temperature. The prepreg can further be shaped into composite material laminated plates or used alone in the adhesive layer of other prepregs, or used in the combination of one or more prepregs with copper foil placed on one or both sides. The resulting laminated plate composite material, obtained by heating the prepreg or the combination under pressure, has significant improvement and superiority to the standards of current products in respect to size stability, resistance to chemicals, resistance to corrosion, moisture absorption, and electrical properties, and is suitable for producing products or parts for electronics, electrics, space, and transport, for example, for manufacturing printed circuit boards and multi-layer circuit boards, etc; or resin-coated(背膠) copper foils for build-up process are made on copper foils by means of the precisely coating method; or dielectric films for build-up process are made by means of coating on releasing films. For example, glass fibrous fabric can be impregnated with the phosphorus-containing epoxy resin composition varnish, or the epoxy resin composition varnish may be coated on copper foil, then dried by heating, giving a dry resin-coated(背膠) copper foil for build-up process. Such resin-coated copper foils for build-up process with good storage stabilities can be stored at room temperature for months, and can be used to manufacture light, thin and small high density products of printed circuits boards by means of a hot pressure process.

The method for producing the flame retarded epoxy resin composition of the present invention allows said composition to harden at a reaction temperature of from 20 to 350° C., preferably of from 50 to 300° C., more preferably of from 100 to 250° C., and most preferably of from 120 to 220° C.

The above-mentioned reaction temperature for hardening must be controlled carefully. If the temperature is above 350° C., there will easily be a side reaction where it will be difficult to control the reaction speed, and where the deterioration speed of the resin may be increased; if the temperature is less than 20° C., in addition to the poor efficiency, it will be more difficult for the resulting resin to meet the required property for usage under high temperature.

The phosphorus-containing flame retarded epoxy resin composition of the present invention can simultaneously improve the flame retarded property and the heat resistance of the epoxy resin without adding other processing auxiliary agents and flame retarded additives. The present invention also provides a phosphorus-and-nitrogen-containing heterocyclic compounds having a functional group reactive with an epoxy group, which allows the epoxy resin composition containing phosphorus and nitrogen heterocyclic compounds and other epoxy resin composition s containing phosphorus and nitrogen compounds of the present invention to have higher flame retarded property, higher heat resistance, and better mechanical properties than the prior art.

EXAMPLE

The present invention will be described in details by the following synthesis examples, but they should not be construed to limit the scope of the present invention.

Epoxy equivalent weight (EEW), viscosity of varnish, and solid content in the examples are measured by the methods as follows.

(1) Epoxy equivalent weight (EEW): the epoxy resin is resolved in the solvent (chlorobenzene:chloroform=1:1) and titrated with HBr/glacial acetic acid, while the epoxy equivalent weight is obtained according to the method in ASTM D1652, wherein the indicator is crystal violet.

(2) Viscosity: the phosphorus containing epoxy resin varnish is placed in a thermostat of 25° C. for 4 hours, while the viscosity of the varnish is measured with a Brookfield viscometer at 25° C.

(3) Solid content: one gram of the epoxy resin composition varnish of the present invention containing phosphorus and nitrogen compounds is placed in an oven of 150° C. for 60 minutes to measure the weight percent of the involatile component, while the solid content is obtained.

The components used in the synthesis example and the examples are described in details as follows.

Epoxy resin 1: the epoxy resin, trade mark BE188EL, manufactured by Chang Chun Plastics Co., Ltd. Taiwan, is a diglycidyl ether of bisphenol A wherein the epoxy equivalent weight is from 185 to 195 g/equivalent weight, the hydrolyzable chlorine content is less than 200 ppm, and the viscosity is between 11000 and 15000 cps/25° C.

Epoxy resin 2: the epoxy resin, trade mark CNE200A80, manufactured by Chang Chun Plastics Co., Ltd. Taiwan, is polyglycidyl ether of cresol-aldehyde condensate wherein the epoxy equivalent weight is from 200 to 220 g/equivalent weight, the solvent is acetone, and the solid content is between 79.0 and 81.0% by weight.

Epoxy resin 3: the epoxy resin, trade mark BEB530A80, manufactured by Chang Chun Plastics Co., Ltd. Taiwan, is diglycidyl ether of tetrabromobisphenol A, wherein the epoxy equivalent weight is from 430 to 450 g/equivalent weight and the bromine content is between 18.5 and 20.5% by weight.

Epoxy resin 4: the epoxy resin, trade mark BEB526A80, manufactured by Chang Chun Plastics Co., Ltd. Taiwan, is a diglycidyl ether of tetrabromobisphenol A, wherein the epoxy equivalent weight is from 410 to 430 g/equivalent weight and the bromine content is between 19.0 and 21.0% by weight.

Hardening agent A: dicyandiamide, 10% solution in dimethylformamide.

Hardening promoter: 2-methylimidazole, 10% solution in dimethylformamide.

Synthesis Example

The Synthesis of a Phosphorus-and-nitrogen-containing Heterocyclic Compound

One-liter high pressure glass reactor fitted with temperature indicating device and condensing reflux device was used, in which the end of the condensing reflux device of the reactor was connected to a hydrochloric acid absorbing tank through a glass tube. 300 ml of chlorobenzene, 150 ml of phosphorus trichloride, and 0.5 g of magnesium chloride were added to the glass reactor. 500 ml of 50% by weight sodium hydroxide aqueous solution was charged into the hydrochloric acid absorbing tank. When the reactor was heated to 131° C. and chlorobenzene was found to start refluxing, chlorine gas was introduced to the reactor at a rate of 20 ml/min and stopped after the reaction mixture was stirred for one hour. Ammonium gas was introduced to the reactor at the rate of 20 ml/min instead, while the gas of hydrochloric acid was found to slowly enter the hydrochloric acid absorbing tank via the glass tube. After the reaction mixture was stirred for three hours, the controlling valve of the reflux line was closed, and the controlling valve of the distillation line was opened. After the chlorobenzene was distillated for 30 minutes, the temperature was decreased to 70° C., 300 ml of 1,4-dioxane, 450 g of phenol and 0.5 g of tetra-n-butyl ammonium chloride were added. The controlling valve of the distillation line was closed, and the controlling valve of the reflux line was opened. The temperature was raised to 101° C., while the solution of 1,4-dioxane began to reflux. After the mire reacted for 2 hours, the reflux line was closed, and then 4 kg/cm² ammonium gas was added. After the reaction mixture was stirred under pressure to react for 1 hour, the controlling valve of the distillation line was opened to discharge unreacted ammonium gas; while the temperature was raised to 101° C. to distill off 1,4-dioxane, and the resulting mixture of phosphorus-and-nitrogen-containing heterocyclic compound product has the structure as shown by formula (I):

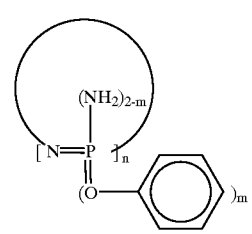

(1)

wherein by $P^{31}$NMR analysis, it is 57.1% for n=3, 21.6% for n=4, 1.9% for n=5, 13.9% for n=6, and 5.5% for n>7. 200 g of epoxy resin 1 (epoxy equivalent weight=188), 200 g of the above obtained cyclic phosphinonitrile, and 2 g of triphenyl phosphine were mixed, stirred, and heated to 180° C. After 2 hours reaction, the temperature was decreased to room temperature, and the epoxy equivalent weight (EEW) of the product of the reaction was measured as 1228. The $NH_2$ equivalent weight of the phosphorus-and-nitrogen-containing heterocyclic compound calculated by the epoxy equivalent weight of the product of the reaction was 271.

Example 1

150.0 g of epoxy resin 1 and 216.2 g of cyclic phosphinonitrile compound (having the structure as shown by formula (I)) obtained in the synthesis example was mixed in a container fitted with a stirrer and a condenser under room temperature. 1.35 g of 2-methylimmidazole as 10% of DMF solution (hardening promoter) and 370 g of methyl ethyl ketone were added and stirred to mix to formulate the epoxy resin varnish of phosphorus-and-nitrogen-containing heterocyclic compound, in which the solid content was about from 40 to 50% by weight, and the viscosity was controlled at about 500 cps/25° C.

A piece of glass fibrous fabric was impregnated with the formulated epoxy resin composition varnish of phosphorus-and-nitrogen-containing heterocyclic compound, and dried at 150° C. to form a prepreg, which was then baked at 180° C. for 120 minutes to give a final prepreg. The finally obtained prepreg was measured for its glass transition temperature by using a differential scan calorimeter (TA2910), and it was then subjected to the burn test according to UL-94 burn test method of American Electric Laboratory to examine its flame retardancy. The results obtained are shown in table 1.

Example 2

150.0 g of epoxy resin 1 and 132.8 g of phosphorus-and-nitrogen-containing heterocyclic compound (having the structure as shown by formula (I)) obtained in the synthesis example were mixed in a container fitted with a stirrer and a condenser under room temperature. 12.6 g of hardening agent A, which did not contain phosphorus, 0.89 g of 2-methylimmidazole as 10% of DMF solution (hardening promoter), and 370 g of methyl ethyl ketone were added and stirred to mix to formulate the epoxy resin composition varnish of phosphorus-and-nitrogen-containing heterocyclic compound.

The glass transition temperature and flame retardency of the formulated epoxy resin composition varnish of phosphorus-and-nitrogen-containing heterocyclic compound were measured according to the same examination methods used in example 1. The results obtained are shown in table 1.

Example 3

150.0 g of epoxy resin 2 and 184.8 g of phosphorus-and-nitrogen-containing heterocyclic compound (having the structure as shown by formula (I)) obtained in the synthesis example were mixed in a container fitted with a stirrer and a condenser under room temperature. 1.30 g of 2-methylimmidazole as 10% of DMF solution (hardening promoter) and 370 g of methyl ethyl ketone were added and stirred to mix to formulate the epoxy resin composition varnish of phosphorus-and-nitrogen-containing heterocyclic compound.

The glass transition temperature and flame retardency of the formulated epoxy resin composition varnish of phosphorus-and-nitrogen-containing heterocyclic compound were measured according to the same examination methods used in example 1. The results obtained are shown in table 1.

Example 4

150.0 g of epoxy resin 2 and 130.6 g of phosphorus-and-nitrogen-containing heterocyclic compound (having the structure as shown by formula (I)) obtained in the synthesis example were mixed in a container fitted with a stirrer and a condenser under room temperature. 30.8 g of hardening agent A, which did not contain phosphorus, 2.1 g of 2-methylimmidazole as 10% of DMF solution (hardening promoter), and 370 g of methyl ethyl ketone were added and stirred to mix to formulate the epoxy resin composition varnish of phosphorus-and-nitrogen-containing heterocyclic compound.

The glass transition temperature and flame retardency of the formulated epoxy resin composition varnish of phosphorus-and-nitrogen-containing heterocyclic compound were measured according to the same examination methods used in example 1. The results obtained are shown in table 1.

Comparative Example 1

125.0 g of epoxy resin 3 and 250 g of hardening agent A, which did not contain phosphorus, were mixed in a container fitted with a stirrer and a condenser under room temperature. 0.625 g of 2-methylimmidazole as 10% of DMF solution (hardening promoter) and 370 g of methyl ethyl ketone were added and stirred to mix to formulate an epoxy resin composition varnish.

The glass transition temperature and the flame retardency of the formulated epoxy resin composition varnish were measured according to the same examination methods used in example 1. The results obtained are shown in table 1.

Comparative Example 2

125.0 g of epoxy resin 4 and 260 g of hardening agent A, which did not contain phosphorus, were mixed in a container fitted with a stirrer and a condenser under room temperature. 0.625 g of 2-methylimmidazole as 10% of DMF solution (hardening promoter) and 370 g of methyl ethyl ketone were added and stirred to mix to formulate an epoxy resin composition varnish.

The glass transition temperature and flame retardency of the formulated epoxy resin composition varnish were measured according to the same examination methods used in example 1. The results obtained are shown in table 1.

TABLE 1

| Formulation for Varnish | Ex. 1 | Ex. 2 | Ex. 3 | Ex. 4 | Comp. Ex. 1 | Comp. Ex. 2 |
| --- | --- | --- | --- | --- | --- | --- |
| Epoxy resin 1 (g) | 150.0 | 150.0 | — | — | — | — |
| Epoxy resin 2 (g) | — | — | 150 | 150 | — | — |
| Epoxy resin 3 (g) | — | — | — | — | 125 | — |
| Epoxy resin 4 (g) | — | — | — | — | — | 125 |
| Cyclic phosphino-nitrile (g) | 216.2 | 132.8 | 184.8 | 130.6 | — | — |
| Hardening agent (g) | — | 12.6 | — | 30.8 | 250 | 260 |
| Promoter (g) | 1.35 | 0.89 | 1.30 | 2.1 | 0.625 | 0.625 |
|  | Prepreg A | Prepreg B | Prepreg C | Prepreg D | Prepreg E | Prepreg F |
| Tg (° C.) | 169 | 174 | 187 | 192 | 132 | 150 |
| Burning test | passed | passed | passed | passed | passed | passed |

Examples 5, 6 and Comparative Examples 3, 4

8 prepregs of each prepreg A (example 1), prepreg C (example 3), prepreg E (comparative example 1), and prepreg F (comparative example 2) were laminated with a 35 μm thich copper foil each on the top and the bottom. The laminated structure and the copper foils were pressed with a pressure of 25 kg/cm$^2$ under 185° C. to form glass fibrous fabric laminates. Each laminated structure (laminated structure A, C, E, and F) was subjected to physical tests. The results of these analyses are shown in table 2.

TABLE 2

| Analytical item | Specification | Ex. 5 (Laminated structure A) | Ex. 6 (Laminated structure C) | Comp. Ex. 3 (Laminated structure E) | Comp. Ex. 4 (Laminated structure F) |
|---|---|---|---|---|---|
| Solderability | IPC 260° C. spec. > 30 sec | passed | passed | passed | passed |
| Strength of peeling | IPC spec. > 8 lbs/in | 8.92 | 8.56 | 9.25 | 8.9 |
| Surface electric resistance | IPC spec. > $10^{12}$ | $2.78 \times 10^{15}$ | $2.36 \times 10^{15}$ | $2.88 \times 10^{15}$ | $3.57 \times 10^{15}$ |
| Volume electric resistance | IPC spec. > $10^{10}$ | $2.10 \times 10^{13}$ | $2.02 \times 10^{13}$ | $1.16 \times 10^{14}$ | $1.06 \times 10^{14}$ |
| Dielectric constant | IPC spec. < 5.4 | 4.45 | 4.81 | 4.72 | 4.60 |
| Loss factor | — | 0.021 | 0.023 | 0.022 | 0.020 |

Examples 7, 8 and Comparative examples 5, 6

An epoxy resin composition varnish was formulated according to the methods described in example 1, example 3, comparative example 1 and comparative example 2, wherein 170 g of the solvent MEK was added, the solid content of the varnish was about from 70 to 80% by weight, and viscosity was controlled at about 2000 cps/25° C. The formulated varnish was coated on the inner sides of 18 μm thick copper foils, and the coating thickness of the coating was 80 μm. After being dried at 175° C. for 3 minutes, the copper foils were pressed with the substrates mentioned above (prepreg A, C, E, and F) under 180° C. with a pressure of 25 kg/cm² for 2 hours to form build-up plates (A, C, E, and F). Their heat resistances, electric properties, and adhesive strengths were analyzed. The results of these tests are shown in table 3.

TABLE 3

| Analytical item | Specification | Ex. 7 (Build-up plate A) | Ex. 8 (Build-up plate C) | Comp. Ex. 5 (Build-up plate E) | Comp. Ex. 6 (Build-up plate F) |
|---|---|---|---|---|---|
| Solderability | IPC 260° C. spec. > 30 sec | passed | passed | passed | passed |
| Strength of peeling | IPC spec. > 8 lbs/in | 8.43 | 8.27 | 8.97 | 8.44 |
| Surface electric resistance | IPC spec.> $10^{12}$ | $1.07 \times 10^{15}$ | $1.12 \times 10^{15}$ | $1.11 \times 10^{15}$ | $1.21 \times 10^{15}$ |
| Volume electric resistance | IPC spec. > $10^{10}$ | $1.57 \times 10^{16}$ | $1.37 \times 10^{16}$ | $1.10 \times 10^{16}$ | $1.11 \times 10^{16}$ |
| Via forming ability | 10 μs/3 shot (laser drill) | OK | OK | OK | OK |

What is claimed is:

1. A flame retarded epoxy resin composition, which comprises:

(A) at least one epoxy resin; and (B) a phosphorus-and-nitrogen containing heterocyclic compound, said compound having a moiety which is capable of reacting with an epoxy group of the epoxy resin, is useful as a hardening agent for the epoxy resin, and having a structure as shown by formula (I):

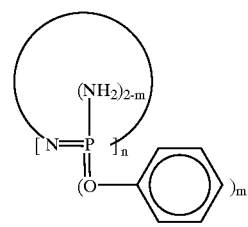

(1)

wherein m is an integer of from 0 to 2, n is an integer of from 3 to 7, but at least one occurrence of m in formula (I) is not 2.

2. A flame retarded epoxy resin composition according to claim 1, further comprising:

(C) a hardening agent, which does not contain phosphorus.

3. The flame retarded epoxy resin composition according to claim 1 or 2, wherein the epoxy equivalent weight (EEW) of said (A) epoxy resin is 600 or less.

4. The flame retarded epoxy resin composition according to claim 1 or 2, wherein said (A) epoxy resin comprises: an epoxy group containing compound modified with a moiety selected from the group consisting of bisphenol, phenol, dihydroxybenzene, bis(biphenol), naphthalene, alkyl, alkenyl hydrocarbon, cyclic hydrocarbon, nitrogen-containing hetero ring, cresol-aldehyde, siloxane, polysiloxane, and aryl phosphate.

5. The flame retarded epoxy resin composition according to claim 4, wherein said epoxy group containing compound is selected from the group consisting of glycidyl ethers, glycidic amines, glycidyl thiol ethers, and glycidyl carbonates.

6. The flame retarded epoxy resin composition according to claim 1 or 2, wherein said (A) epoxy resin is a glycidyl ether modified with a moiety selected from the group consisting of bisphenol, bis(biphenol), dihydroxybenzene, polyols, and silicones.

7. The flame retarded epoxy resin composition according to claim 6, wherein said modified glycidyl ether is selected from the group consisting of:
(1) bisphenol modified diglycidyl ether having —Ph—X—Ph—, wherein X is $CH_2$, $C(CH_3)_2$, $CH(CH_3)$, O, S, C=O, or $SO_2$;
(2) bis(biphenol) modified glycidyl ether selected from 4,4'-diphenol glycidyl ether, 3,3'-dimethyl-4,4'-diphenol glycidyl ether, or 3,3',5,5'-tetramethyl-4,4'-diphenol glycidyl ether;
(3) dihydroxybenzene glycidyl ether selected from resorcinol glycidyl ether, p-dihydroxybenzene glycidyl ether, or isobutyldihydroxybenzene glycidyl ether;
(4) phenolic polyglycidyl ether selected from phenol-aldehyde polyglycidyl ether, cresol-aldehyde polyglycidyl ether, or bisphenol A-phenolic polyglycidyl ether;
(5 polyhydroxyl phenyl phenol polyglycidyl ether selected from tri(4-hydroxyl phenyl)methane polyglycidyl ether, tri(4-hydroxyl phenyl)ethane polyglycidyl ether, tri(4-hydroxyl phenyl)propane polyglycidyl ether, tri (4-hydroxyl phenyl)butane polyglycidyl ether, tri(3-methyl4-hydroxyl phenyl)methane polyglycidyl ether, tri(3,5-dimethyl-4-hydroxyl phenyl)methane polyglycidyl ether, tetra(4-hydroxyl phenyl)ethane polyglycidyl ether, tetra(3,5-dimethyl-4-hydroxyl phenyl) ethane polyglycidyl ether; or a mixture of two or more modified glycidyl ethers.

8. The flame retarded epoxy resin composition according to claim 7, wherein said modified glycidyl ether is selected from the group consisting of bisphenol A polyglycidyl ether, resorcinol glycidyl ether, tri(4-hydroxyl phenyl)methane polyglycidyl ether, tetra(4-hydroxyl phenyl)ethane polyglycidyl ether, cresol phenolic polyglycidyl ether, and mixtures thereof.

9. The flame retarded epoxy resin composition according to claim 1 or 2, wherein said (A) epoxy resin is modified with silicones or rubber copolymers.

10. The flame retarded epoxy resin composition according to claim 9, wherein said silicone compounds are siloxanes with amino ending groups, and said rubber copolymers are copolymers of butadiene and acrylonitrile with carboxy or amino ending groups.

11. The flame retarded epoxy resin composition according to claim 1 or 2, wherein the contents of (A) epoxy resins and (B) phosphorus-and-nitrogen-containing heterocyclic compounds are such that, according to the reactive hydrogen equivalent weight and epoxy equivalent weight of epoxy resin, the reactive hydrogen equivalent weight of hardening agents is from 20% to 95%, related to the epoxy equivalent weight of 100%.

12. The flame retarded epoxy resin composition according to claim 2, wherein said (C) hardening agent, which does not contain phosphorus, is selected from the group consisting of dicyandiamide, diaminodiphenylmethane, diethyltriamine, diaminodibenzenesulfone, m-phenyldiamine, methyl diphenylamine, maleic acid, phthalic acid, hexahydrophthalic acid and tetrahydrophthalic acid.

13. The flame retarded epoxy resin composition according to claim 2, wherein said (C) hardening agent, which does not contain phosphorus, is selected from the group consisting of a tertiary amine, quaternary ammonium salt, tertiary phosphine, quaternary phosphonium salt, and imidazole compound.

14. The flame retarded epoxy resin composition according to claim 2, wherein said (C) hardening agent, which does not contain phosphorus, comprises a reactive hydrogen equivalent weight and an epoxy equivalent weight of epoxy resin, wherein the reactive hydrogen equivalent weight is from 20% to 95%, related to the epoxy equivalent weight of 100%.

15. The flame retarded epoxy resin composition according to claim 1 or 2, wherein the resin composition further comprises at least one additive selected from thermal stabilizers, light stabilizers, ultraviolet absorbers, plasticizers, and inorganic fillers.

16. A flame retarded epoxy resin hardening composition, which is characterized that said hardening composition is made by hardening the flame retarded epoxy resin composition according to claim 1 or 2.

17. The flame retarded epoxy resin composition according to claim 2 further comprising:
(D) a hardening promoter;
(E) a solvent; and
(F) additives.

18. The flame retarded epoxy resin composition according to claim 17, wherein the content of said (D) hardening promoter is from 0.005% to 5.0% by weight based on the total weight of the composition.

* * * * *